US006546531B1

(12) United States Patent
Quach et al.

(10) Patent No.: US 6,546,531 B1
(45) Date of Patent: Apr. 8, 2003

(54) AUTOMATIC DELAY ELEMENT INSERTION SYSTEM FOR ADDRESSING HOLDTIME PROBLEMS

(75) Inventors: Le Quach, San Jose, CA (US); Lakshminarasimhan Varadadesikan, Santa Clara, CA (US); Dale R. Greenley, Los Gatos, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 197 days.

(21) Appl. No.: 09/684,284

(22) Filed: Oct. 6, 2000

(51) Int. Cl.[7] ................................................. G06F 9/45
(52) U.S. Cl. ..................... 716/6; 716/6; 716/5; 716/4
(58) Field of Search ............................... 716/5, 6, 18, 4, 716/8; 327/158, 208; 395/183.09; 375/356

(56) References Cited

U.S. PATENT DOCUMENTS

| 5,369,640 | A | * | 11/1994 | Watson et al. | 307/409 |
| 5,717,729 | A | * | 2/1998 | Iknaian et al. | 327/153 |
| 5,841,967 | A | * | 11/1998 | Sample et al. | 703/14 |
| 6,205,572 | B1 | * | 3/2001 | Dupenloup | 716/2 |
| 6,300,807 | B1 | * | 10/2001 | Miyazaki et al. | 327/149 |
| 6,377,097 | B1 | * | 4/2002 | Shuler, Jr. | 327/208 |

* cited by examiner

Primary Examiner—Vuthe Siek
Assistant Examiner—Binh C. Tat
(74) Attorney, Agent, or Firm—Martine & Penilla, LLP

(57) ABSTRACT

Hold time methods, systems, and computer program products are implemented to ensure that storage elements in a circuit have sufficient hold times without detrimentally affecting cycle times for other paths in the circuit. Electric circuits are designed by determining which storage elements have hold-time deficiencies, and by inserting an appropriate time delay element in a selected path preceding the storage element, or at a source or destination storage element, without exceeding a predetermined cycle time in a second path that overlaps the first path, for at least one storage element in an electrical circuit. The invention simulates insertion of the time delay element before or after a logic element that precedes a storage element that has a hold-time deficiency. The invention determines which storage elements and which circuit paths between adjacent storage elements are subject to hold time deficiencies, assembles a hold time deficiency list, and determines whether a selected hold-time-deficient storage element can be preceded with a delay element without violating a cycle time constraint in another cycle path. The invention further includes determining the placement of a delay element in a storage system having a network of storage elements interconnected with logic elements by using a criterion that protects cycle times in other storage element paths with slower signal propagation. The method further includes modifying a net list of storage and logic element interconnections to include insertion of one or more time delay elements.

16 Claims, 10 Drawing Sheets

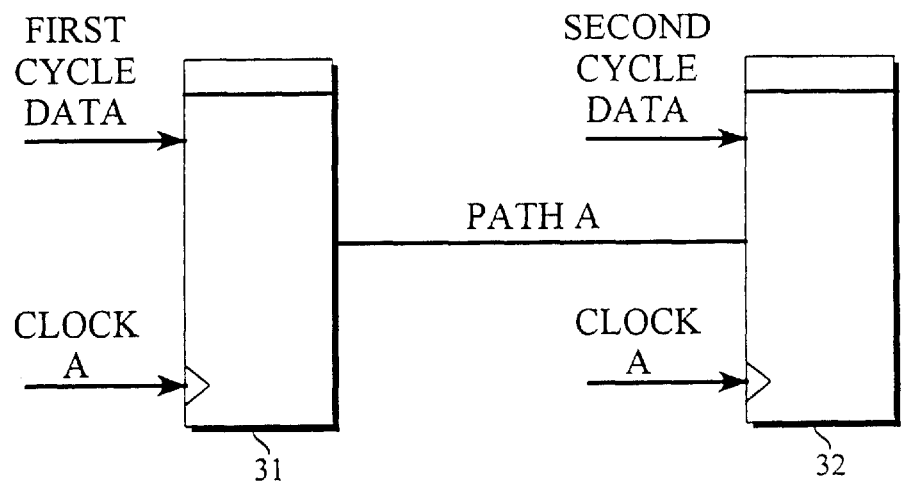
Fig. 2A *(Prior Art)*
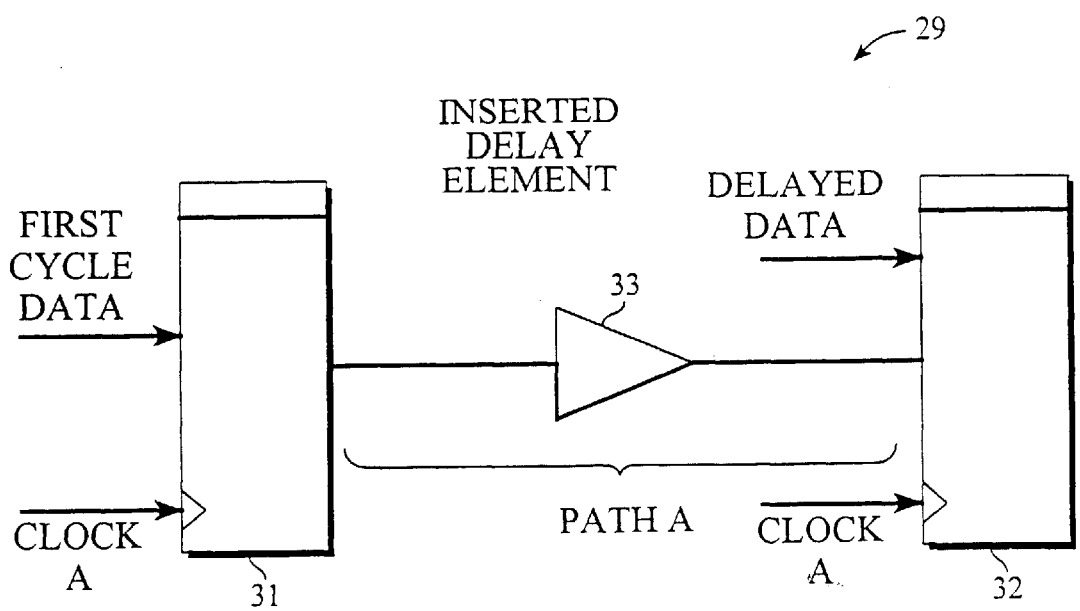
Fig. 2B *(Prior Art)*

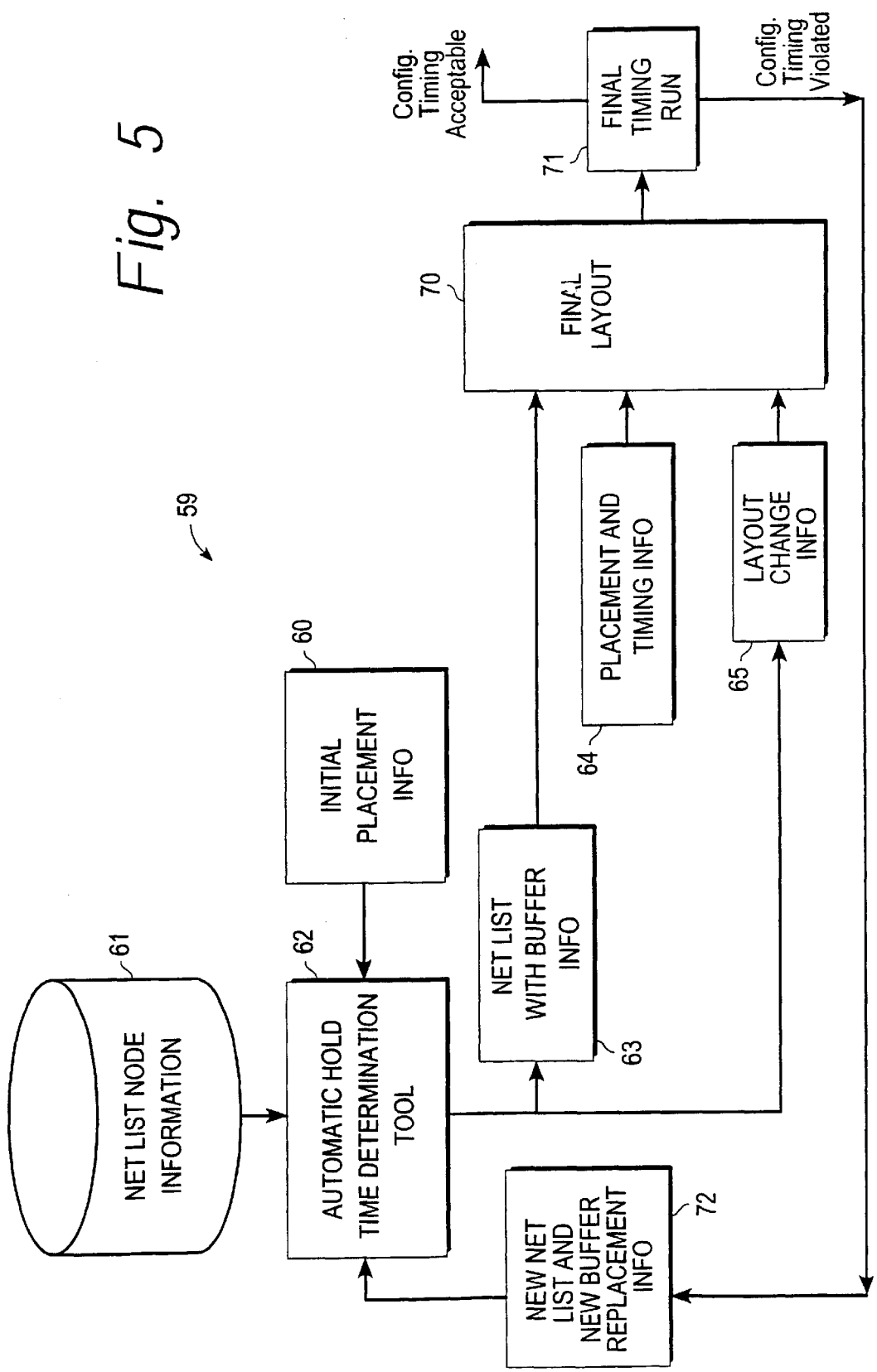

AUTOMATIC DELAY ELEMENT INSERTION SYSTEM FOR ADDRESSING HOLDTIME PROBLEMS

BACKGROUND OF THE INVENTION

1. Technical Field

This invention relates to an automated approach for inserting delay elements into complex, high performance VLSI circuits to address hold time problems; and more particularly to development of an algorithm and CAD solution to insert delay elements

2. Description of the Related Art

A hold time problem occurs in synchronous circuits (where operations of the circuit elements are synchronized with respect to a common timing signal, called "clock"), when the data to be registered in a storage element (referred to herein as a "flop"), when clocked, does not remain stable for at least a "holdtime" interval for the flop. The holdtime of a flop arises from the non-zero circuit delay associated with flow of data from the clock input of the flop to the point of data storage within the flop.

Hold time problems in VLSI circuits lead to incorrect data storage in a storage element or flop. The term "flop" often refers to a flip-flop, a typical circuit storage element. Incorrect data storage is likely to occur in synchronous circuits that are synchronized during operation to the clocks driving the elements in the circuits. In particular, a hold time problem occurs when data is stored in a flop after the flop has been clocked, without providing a sufficient hold time for the data. When the data is registered in a flop after clocking, the data does not remain stable for at least a time equal to what is termed the required "hold time" of a flop. As discussed in the following in connection with FIG. 2A, one flop can hold data sent by another flop. That is, a source flop can send data to a destination flop, in successive circuit cycles. However, before the destination flop can hold data sent from a source flop in a previous cycle, data from the source flop in the current cycle may reach the same destination flop and change the value held in the destination flop, because of speed of transport along the paths between the source flop and the destination flop. Accordingly, functional failure can occur. Due to the nature of the construction of such storage elements, the occurrence of hold time problems is common during design processes for electric circuits implemented in very large scale integration of semiconductor chips.

It is desirable to eliminate functional failures stemming from hold time problems. Industry standard computer aided design (CAD) tools are known that address hold time problems. However, such tools do not take into account the serious side effects of hold time problems. In particular, solving the delay problem in a certain path by inserting a delay element may cause an excessive cycle time delay to occur in another path, which detrimentally affects overall circuit performance by further limiting the maximum frequency response of that portion of the circuit. Accordingly, it is desirable that insertion of appropriate time delay values be done at appropriate points in hold time paths, to avoid compromising performance from a frequency perspective. It is unacceptable to insert a time delay element in a path experiencing a hold time problem without considering possible detrimental cycle time consequences elsewhere.

It is further desirable to eliminate the technical problems relating to hold time dysfunctionalities during the design of semiconductor chips involved in VLSI development, construction, and fabrication.

SUMMARY OF THE INVENTION

According to the present invention, an algorithm compensates for the limitations of standard CAD tools and hence reduces design convergence time. In particular, all the paths not meeting the hold time requirements are collected in a list or table. Next, an arbitrary storage element in a selected signal path that has a hold time problem is evaluated for time delay correction by insertion of a delay element immediately preceding the selected storage element. However, if such a proposed insertion has detrimental cycle time consequences for another path involving this element, detrimentally affecting circuit speed or maximum frequency response, for example, the proposed insertion is not implemented. Instead, another path or logic gate is considered for possible insertion of a delay element immediately preceding the selected storage element in a local span of the path under evaluation. By evaluating the successive paths in a recursive fashion, the appropriate points in a circuit path are automatically selected for insertion of delay elements in a global fashion. Further, particular time delay elements are selected with appropriate delay values from a library of delay element values, to ensure that the delay selected has a margin greater than the delay required to solve the local hold time problem without detrimental global consequences within the circuit under design.

BRIEF DESCRIPTION OF THE DRAWINGS

FIGS. 2A–2B are diagrams of storage element systems including a data path between the storage elements, according to the prior art.

FIG. 2C is a timing diagram of clock and data signals, illustrating actual and required hold times to enable effective data transfer between first and second storage elements in a synchronous electrical system subject to improvement in accordance with the present invention.

FIG. 5 is a block diagram of a design tool system according to the present invention, in which an automatic hold time determination tool is used to modify an original net list specifying an electrical system under design.

DETAILED DESCRIPTION OF THE ILLUSTRATED EMBODIMENTS

Figure 1:
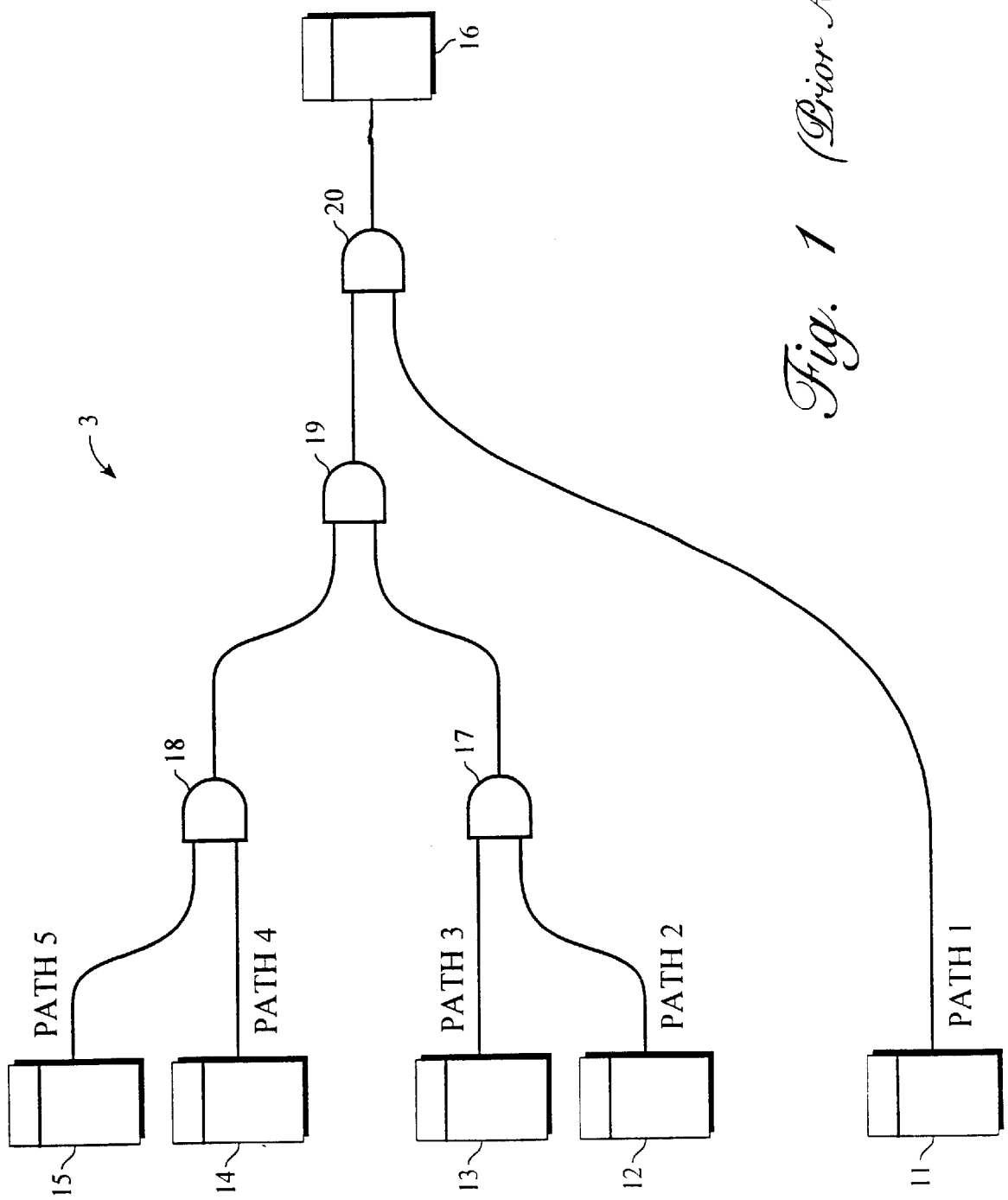
FIG. 1 is a general block diagram of a circuit system including storage elements and gates interconnected in a plurality of paths leading to a single storage element, in accordance with the prior art.
Figure 26:
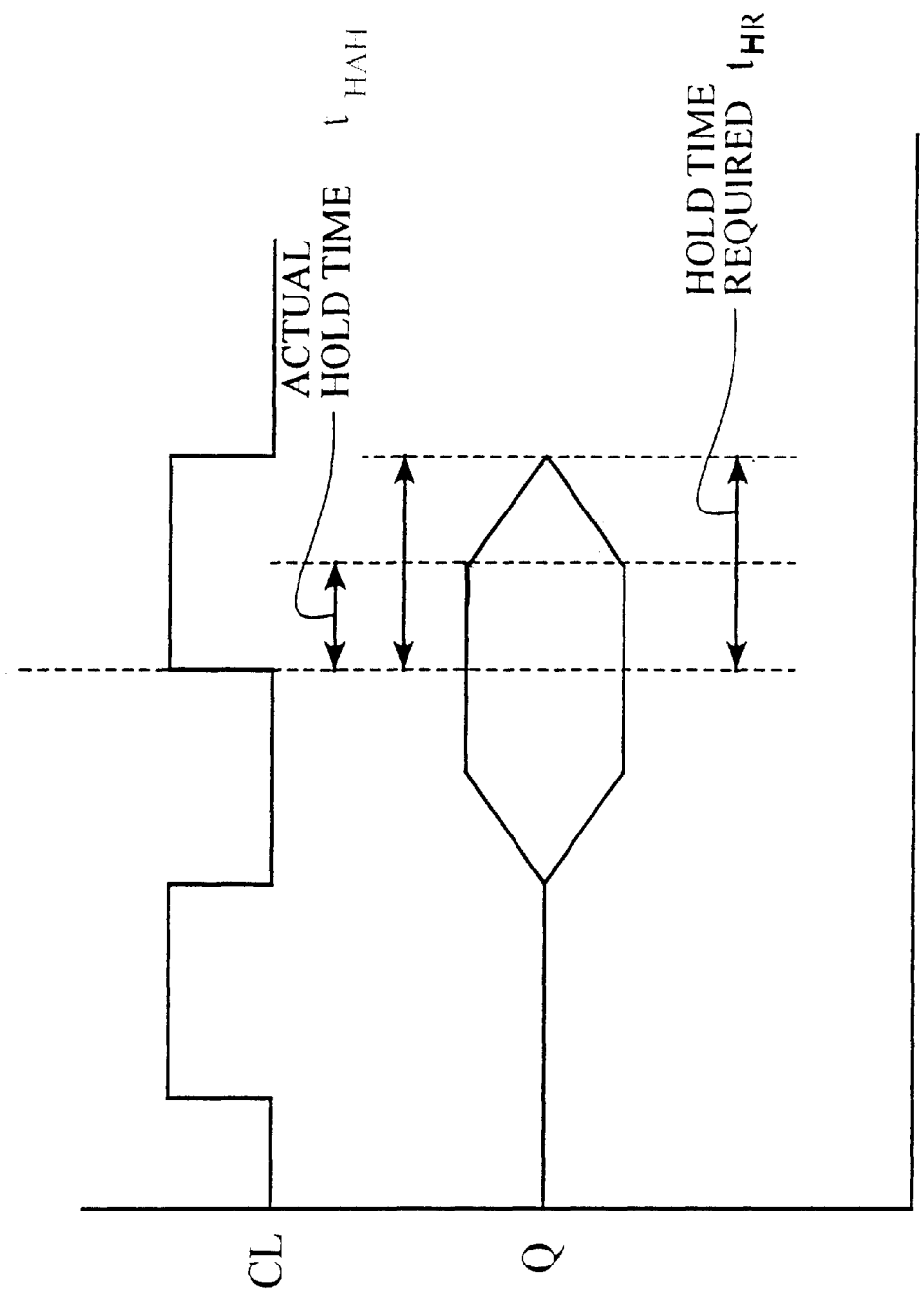

FIG. 1 shows a general block diagram of a circuit system 3 including storage elements and gates interconnected in a plurality of paths leading to a single storage element, in accordance with the prior art. In particular, the circuit system 3 under design includes a plurality of storage elements 11–16 that, for example, may be flip flops. The circuit system 3 further includes logic elements or gates 17–20, resulting in the establishment of data paths 1–5, respectively, between storage elements 11–15 and the storage element 16. In particular, the path 1 extends from the storage element 11 to the storage element 16 and passes through a logic element 20. Similarly, the paths 2 and 3 extend from the storage elements 12 and 13, respectively, to the storage element 16 through the logic elements 17, 19, and 20. Additionally, each of the paths 4 and 5 extends from the storage elements 14 and 15, respectively, through the logic elements 18, 19, and 20 to the storage element 16.

Conventional design tools are used to determine the hold time value for each of the storage elements 11–16 and the cycle time values along each of the paths 1–5 between the corresponding storage elements 11–15 and through the corresponding logic elements or gates 17–20. Assuming that the wires in each path have similar characteristics, that the gates in each element are symmetric or identical, and that the flops in each path have similar characteristics, it is usually true that the cycle time along path 1 is the smallest, where this path traverses the least number of gates, as compared with the other paths 2–5. Accordingly, if a delay element is inserted between logic element 20 and storage element 16, the cycle time along a modified path 1 is less likely to be detrimentally affected than the cycle time along any of the paths 2–5, where a cycle time for the modified path may be excessive and detrimental to overall global circuit speed.

FIGS. 2A and 2B are diagrams of respective storage element systems 28 and 29 including a data path A between the storage elements, according to the prior art. In particular, each of the storage element systems 28 and 29 includes first and second storage elements 31 and 32 (flops) connected by a data path A. Each of the storage elements 28 and 29 is synchronized by pulses from a clock A. Each of the storage element systems, 28 and 29, shown may be a flip flop. However, another electric component or device can be substituted, as long as the storage element in fact is capable of storing information.

In one situation, the flop 32 shown in FIG. 2A has insufficient hold time to handle information provided along path A from the flop 31. In other words, when first cycle date is provided to the flop 31 and is transmitted to the flop 32 along path A, there is no assurance that the data provided to the second flop 32 during the first cycle time will actually be held on the flop 32 long enough for the data to be read or accepted by the flop 32. This situation illustrates a hold time problem.

FIG. 2B shows a typical solution in the prior art for the hold time problem. Simply stated, a delay element 33 is inserted in path A to provide extended hold time for data clocked out of the flop 31 to be accepted by the flop 32. The delay element 33 selected for insertion is sufficient to provide a delay extension adequate to provide a sufficient hold time for the flip flop 32 to capture data received from the flip flop 31. It is assumed, in the prior art, that the cycle time delay caused in data transmission through the first and second flops, 31 and 32, will be acceptable.

FIG. 2C shows a timing diagram of clock and data signals, illustrating actual and required hold times to enable effective data transfer between first and second storage elements in a synchronous electrical system, subject to improvement according to the present invention. In particular, FIG. 2C shows a clock signal waveform CL including rising and falling edges, repeating itself in alternating between two distinct levels, "0" and "1". A Q data signal is provided from an output terminal of a source flop and is applied to an input terminal of a destination flop, requiring a hold time value of at least $t_{HR}$. However, the actual hold time provided may be a lesser value $t_{AH}$ Because the actual hold time $t_{AH}$ is less than the minimum required hold time $t_{HR}$, according to the example provided, the second data storage element fails to reliably acquire the data provided from the first data storage element. This illustrates a hold time problem.

Figure 3:
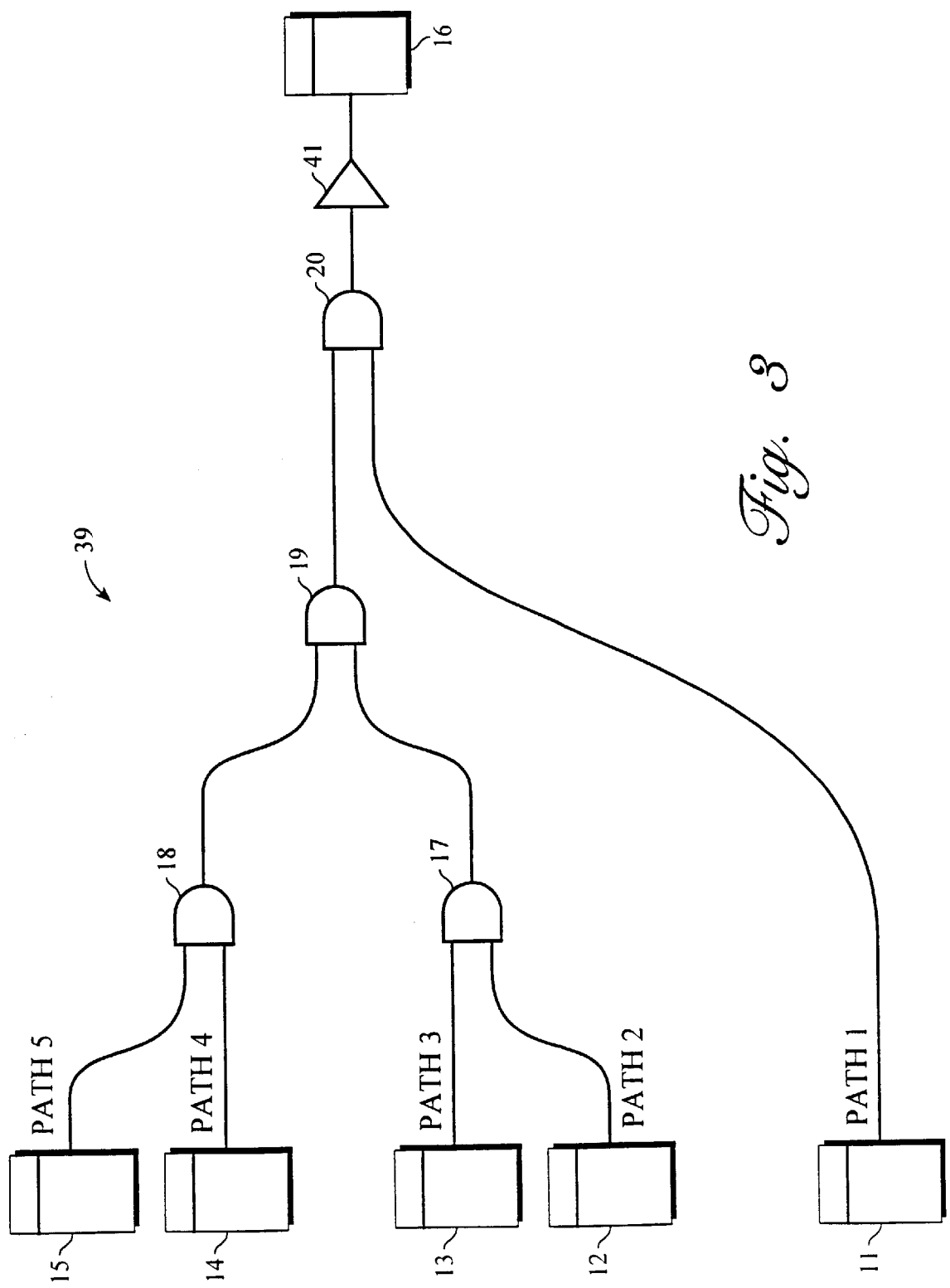
FIG. 3 is a general block diagram of a circuit system including storage elements and gates interconnected in a plurality of paths leading to a single storage element that is provided with a local delay element immediately preceding a storage element experiencing a hold time problem.

FIG. 3 is a block diagram of a circuit system 39, including storage elements and gates interconnected in a plurality of paths leading to a single storage element, which is provided with a local delay element immediately preceding a storage element suffering from a hold time problem, in accordance with the prior art. The circuit system 39 includes a plurality of storage elements 11–16, which may be Hip flops or other flop devices. The circuit system 39 further includes logic elements or gates 17–20, resulting in the establishment of data paths 1–5 between the respective storage elements 11–15 and the storage element 16. Further, a time delay element 41 is inserted immediately before the storage element 16, which is assumed to be experiencing a hold time problem of determinable time extent. In particular, path 1 extends from storage element 11 through logic element 20 and through delay element 41 to storage element 16; path 2 extends from storage element 12 through logic elements 17, 19, and 20 and delay element 41 to storage element 16; path 3 extends from storage element 13 through logic elements 17, 19 and 20 and delay element 41 to storage element 16; path 4 extends from storage element 14 through logic elements 18, 19, and 20 and delay element 41 to storage element 16; and path 5 extends from storage element 15 through logic elements 18, 19, and 20 and delay element 41 to storage element 16.

Conventional design tools have been used to determine the hold time value through each of the delay elements 11–16 and to determine what are the cycle times along each of the paths 1–5 between the respective delay elements 11–15 and through the applicable logic elements 17–20. Assuming that similar wires and flops and symmetric gates are used, it is intuitively clear that the cycle time along path 1 is the smallest, where this path traverses the least number of logic elements, as compared with the other paths 2–5. Accordingly, with a delay element 41 inserted immediately before the storage element 16, the cycle time along path 1 is less likely to be detrimentally affected, while the cycle time along one or more of the paths 2, 3, 4 and 5 is more likely to be excessive and detrimental to overall global circuit speed, through an unacceptable reduction in maximum frequency response of that portion of the circuit. Thus, the conventional insertion of delay element 41 immediately preceding storage element 16 may be detrimental for some paths, because of increased circuit cycle times, but not for other paths.

Figure 4:
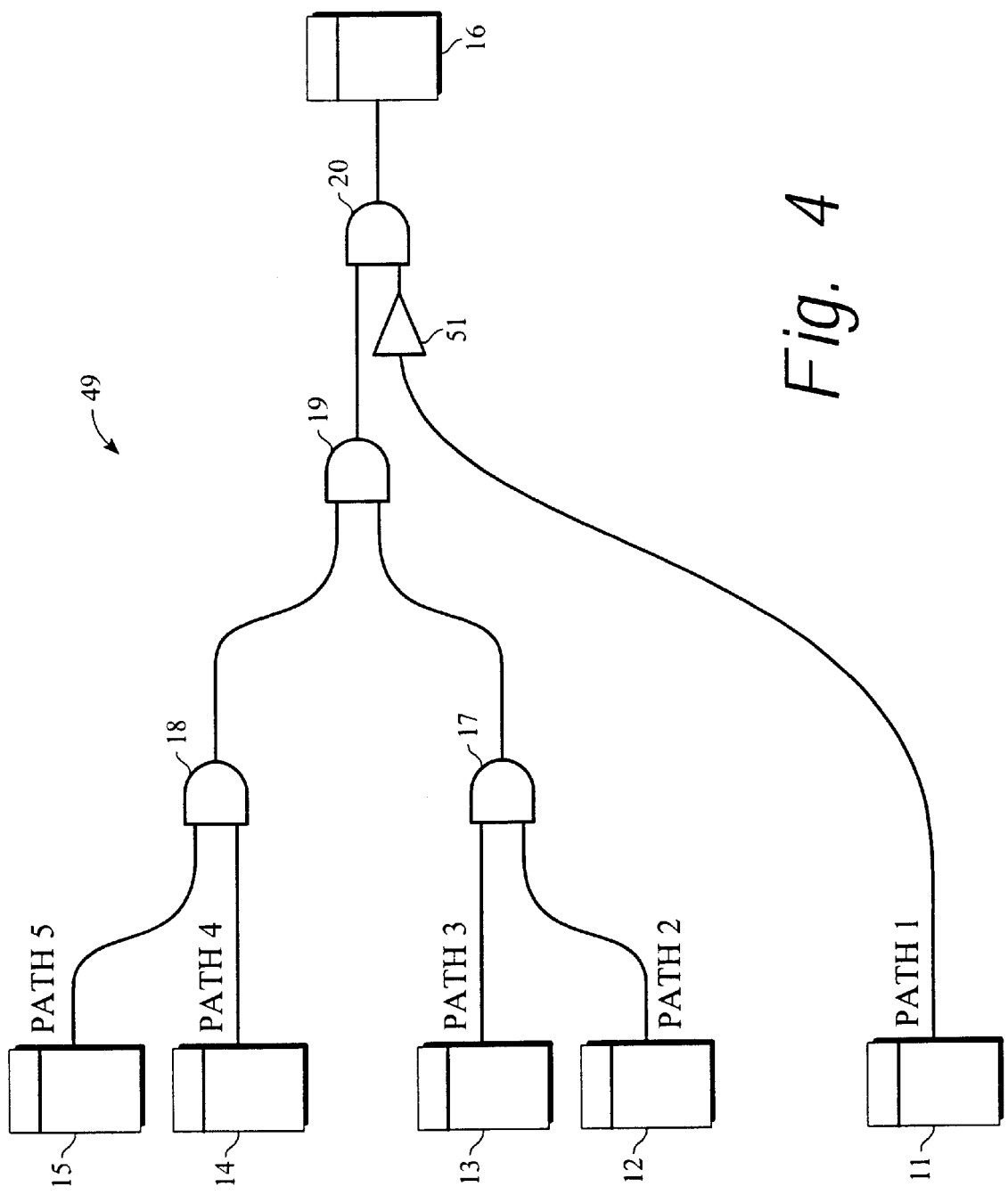
FIGS. 4 and 7 are general block diagrams of circuit systems including storage elements and gates interconnected in a plurality of paths leading to a single storage element that is provided with a local delay element immediately preceding a gate that precedes a storage element suffering from a hold time problem, in accordance with the present invention.

FIG. 4 is a block diagram of a circuit system 49, including storage elements 11–16 and gates 17–20 interconnected in a plurality of paths leading to a single storage element, in which a local delay element 51 is provided in one path only. The local delay element 51 is positioned immediately preceding a logic element 20, which precedes a storage element 16 that is experiencing a hold time deficiency. This physical proximity of the delay element 51 to the immediately following logic element 20 also serves to eliminate additional wire delay that would occur with a random placement of the delay element 51 along that path. The circuit system 49 includes a plurality of storage elements 11–16, some or all of which may be flip flops. The circuit system 49 further includes logic elements or gates 17–20, resulting in the establishment of data paths 1–5 between the respective storage elements 11–15 and a common storage element 16. In particular, path 1 extends from storage element 11 through delay element 51 and logic element 20 to storage element 16; path 2 extends from storage element 12 through logic elements 17, 19, and 20 to storage element 16; path 3 extends from storage element 13 through logic elements 17, 19 and 20 to storage element 16; path 4 extends from storage element 14 through logic elements 18, 19, and 20 to storage element 16; and path 5 extends from storage element 15 through logic element 18, 19, and 20 to storage element 16. Paths 2, 3, 4 and 5 do not pass through the delay element 51 so that cycle time along and through any of paths 2, 3, 4 and 5 is not detrimentally affected by the insertion of delay element 51. Thus, the cycle path times for the paths 2, 3, 4 and 5 are protected from the effects of an increased hold time provision on the path 1.

FIG. 5 is a block diagram of a design tool system 59 configured according to the present invention, in which an initial placement information module 60 and a net list node information module 61 provide information for an automatic hold time determination tool 62. The holdtime determination tool 62 modifies an original net list specifying an electrical system under design and provides this information to a net list with buffer info module 63. The net list node/buffer info module 63 will receive and contain information concerning new buffers representing new delay elements inserted at selected locations in the circuit paths. Initially, the hold time determination tool 62, according to the present invention, determines the values, identities and locations of new delay elements to be inserted at selected locations within the circuit system being designed. The net list node module/buffer info 63 may be used conventionally to provide data, including specification of path segments that interconnect circuit elements, for a final layout module 70.

A placement and timing module 64 provides placement and/or timing information for the elements in a geographic arrangement on a semiconductor chip, using, for example, the placement tool Aquarius available from Avanti. The placement and timing module 64 also provides timing information indicating a minimum hold time value for each storage element, using a timing analysis tool, such as Pearl, available from Cadence Systems, or a dynamic tool such as Spice. This placement and timing information is provided by the hold time determination tool 62 according to the present invention. A layout change module 65 provides information on changes in layout and buffer placement.

Ultimately, information is received by a final layout module 70 from the net list node information module 63, from the placement and timing information module 64 and from the layout change module 65 and is used to determine an acceptable layout, taking into account any hold time problems. Each configuration determined by the final layout module 70 is presented to a final timing run module 71 for a final time check. If any storage element in this configuration still presents a timing violation, the configuration is routed to a new net list/new buffer placement information module 72 and to the hold time determination tool 62 for reprocessing. If this configuration presents no further timing violation, the (final) configuration is identified as such and transmitted by the final timing run module 71 to an appropriate recipient of the configuration.

Figure 6A:
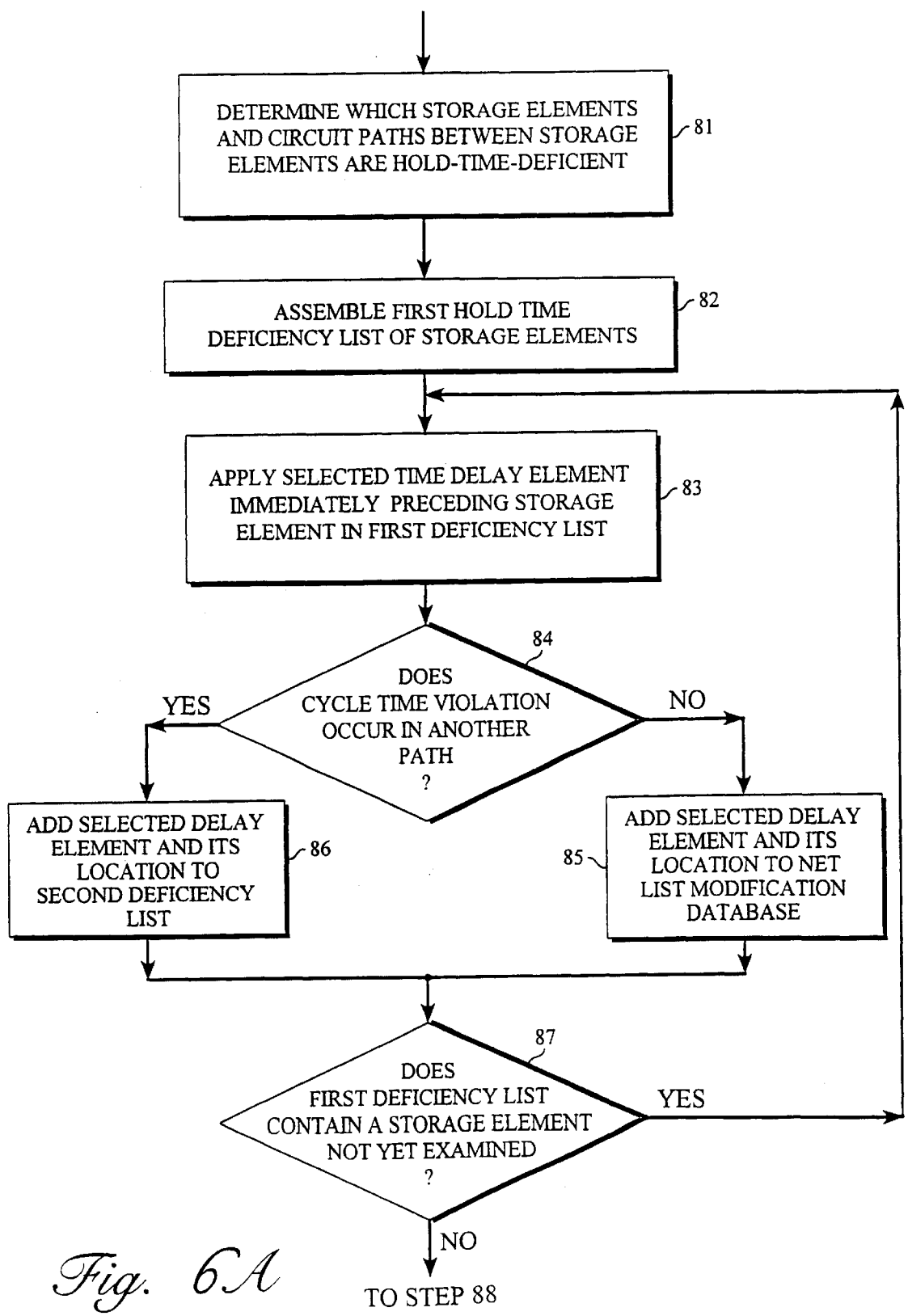
FIGS. 6A–6B are a flow chart of design tool operation in accordance with the present invention.
Figure 6B:
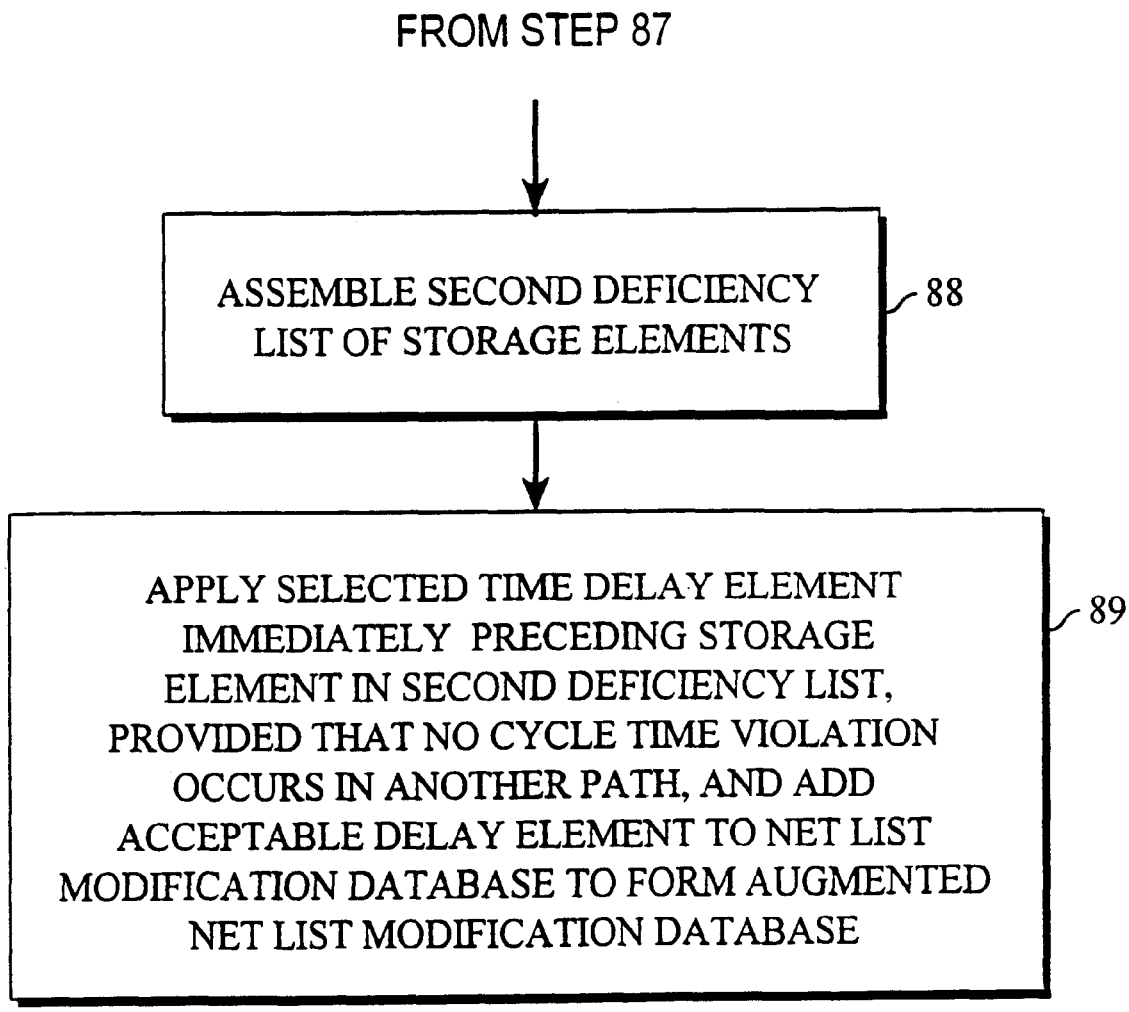

FIGS. 6A–6B shows a flow chart of design tool operation according to one embodiment of the present invention. The hold time determination tool 62 (FIG. 5) determines which storage elements and circuit paths between storage elements are subject to hold time deficiencies in a first process 81. Based upon this determination, a first hold time deficiency list, including at least one hold-time-deficient storage element, is assembled in a second process 82.

For each hold-time-deficient storage element in the first deficiency list, a selected time delay element of appropriate size (at least as large as, and preferably slightly greater than, the determined hold time deficiency) is applied immediately preceding a selected storage element in a third process 83, provided that insertion of the selected delay element does not have unacceptable detrimental side effects on another cycle path between a pair of storage elements. An acceptable delay element would be inserted between first and second nodes on the net list, with one of the first and second nodes being an input node for the hold-time-deficient storage element.

In a process 84, the system determines if a cycle time violation occurs in another path, with the selected time delay element included before the selected storage element from the first deficiency list. If the answer to the query in the process 84 is "no", the selected delay element and its location are added to a net list modification database, in a process 85, and the system moves to a process 87. If the answer to the query in the process 84 is "yes", the selected delay element and its location are added to a second deficiency list for further processing, in a process 86, and the system moves to the process 87.

In the process 87, the system then determines if the first deficiency list contains at least one more storage element that has not yet been examined in the processes 83 and 84. If the answer to the query in the process 87 is "yes", the system returns to the process in 83 and repeats the processes 83 and 84. If the answer to the query in the process 87 is "no", the system continues to a process 88.

Each delay element in the second deficiency list immediately precedes a corresponding hold-time-deficient storage element; and each of these corresponding storage elements has an immediately preceding storage element (ignoring the presence of any delay element), upstream from the corresponding hold-time-deficient storage element, unless the corresponding storage element is the first storage element in that path. These immediately following storage elements are identified as members of the second deficiency list in the process 88. A member of the second deficiency list need not be hold-time-deficient.

Different types of time delay elements (e.g., for a small gate load or for a large gate load) can be chosen and inserted immediately preceding a hold-time-deficient storage element, depending upon the local environment of the storage element. A storage element can have one, or more than one, non-clock input; and each non-clock input is preferably analyzed independently to determine if a hold time deficiency is present at that storage element.

Assume that the storage element 16 in FIG. 3 has a hold time deficiency problem, and that it is proposed to insert a delay element (41 in FIG. 3) between the logic element 20 and the storage element 16 to correct the deficiency. If this proposed insertion is simulated and produces an unacceptable detrimental effect (e.g., lowering the maximum response frequency) in this or another path, the delay element may be inserted on each qualifying path immediately before (upstream of) the logic element 20. In the situation shown initially in FIG. 3, a delay element 51 would be inserted after the storage element 11 and immediately before the logic element 20, as shown in FIG. 4; and a delay element 91 would be inserted after the logic element 18 and immediately before the logic element 19, as illustrated in FIG. 7.

More generally, assume that M logic elements, numbered m=1, 2, . . . , M (M>=1), immediately precede a given storage element, that logic element number m is immediately preceded by a total of e(m) logic elements and storage elements, and that the given storage element is hold-time-deficient. In FIG. 7, for example, M=1 and e(1)=2. Each of the M locations between logic element number m (m=1, . . . , M) and the given storage element is first examined to determine if the proposed insertion: (1) compensates for the hold time deficiency and (2) produces a detrimental side effect, if any, that is tolerable or acceptable. If both conditions (1) and (2) are satisfied for a particular time delay insertion, the hold time deficiency problem is compensated, using that insertion. If condition (1) is satisfied but condition (2) is not satisfied for any of the (first level) insertions between one of the M preceding logic elements and the given storage element, the system considers as many as N(M) (second level) time delay insertions, immediately preceding the M logic elements, where the integer N(M) is defined by $$N(M) = \sum_{m=1}^{M} e(m). \quad (1)$$

The maximum number of insertion location candidates for first and second level insertions is a sum, M+N(M).

Figure 7:
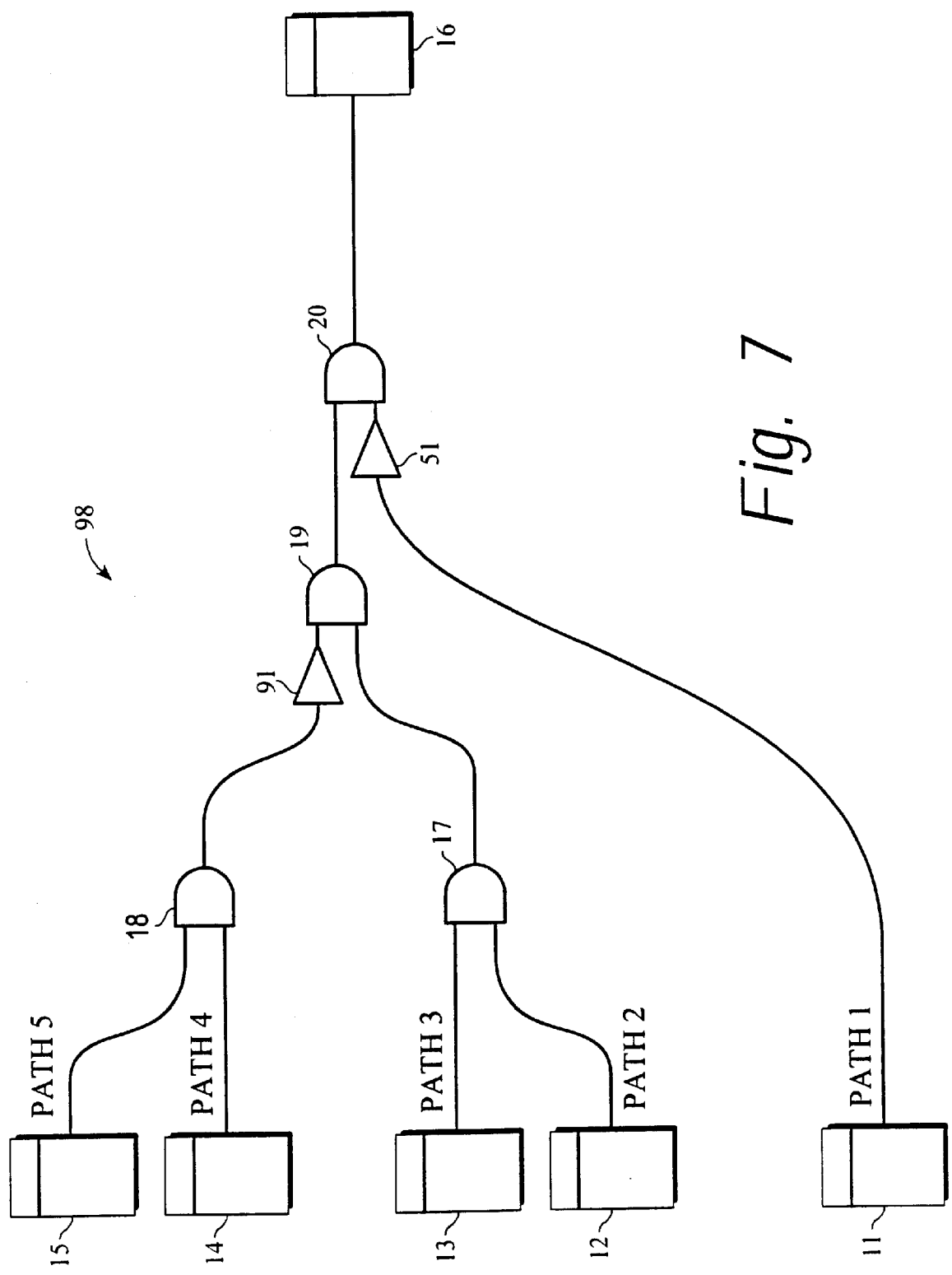

A delay element (51 or 91), inserted at one of the locations indicated in FIG. 4 and FIG. 7, will compensate for the hold time deficiency problem at the storage element 16; and it is likely, although not guaranteed, that at least one of these insertions will not produce an unacceptably detrimental side effect for one of the other storage elements in the circuit.

For each selected storage element in the second deficiency list, a determination is made as to whether to apply a selected delay element of appropriate size (preferably slightly greater than the determined hold time deficiency) immediately preceding the selected storage element in the second deficiency list, in a process 89 in FIGS. 6A–6B provided that insertion of the selected delay element does not have unacceptable detrimental side effects on another cycle path between a pair of storage elements. The acceptable delay elements, if any, associated with the second deficiency list are added to the net list modification data base to form an augmented net list modification data base, in the process 89.

A hold time deficiency can also be addressed using a second approach, sometimes referred to as a "flop swap." In a flop swap, time delay of an output signal from a source storage element and/or time delay of processing of a received signal at a destination storage element is varied, within permitted limits, in order to partly or fully compensate for the hold-time-deficient storage element. Operation of the circuit, with this variation in intrinsic time delay incorporated, must also be simulated to determine if such variation produces an unacceptable frequency response or other detrimental effect in any path of the circuit. Where an unacceptable frequency response effect occurs, a logic element, having different delay parameters and immediately preceding the hold-time-deficient storage element, is chosen instead of the flop swap.

A flop swap is attractive where the variation in delay can be implemented in a storage element having the same physical size as the original storage element, in order to simplify any layout changes and to substantially reduce design turnaround time. However, the amount of additional delay available through a flop swap is limited, as compared with insertion of an additional delay element.

In a third approach, a size parameter p of a hold-time-deficient storage element is varied over a permitted range (e.g., p=1s, 2s, 4s, 8s, 16s, where s is a selected size unit) in order to vary a reaction time interval length Δt(p) associated with the storage element. A storage element with a smaller size parameter p (e.g., 2s, as opposed to 4s) will react more slowly (have a lower maximum frequency response) and will have a larger associated reaction time interval length Δt(p). Any of the first, second and third approaches, or combinations thereof, can be applied to a hold time deficiency problem at a given storage element. This approach is applicable to any element on a signal processing path.

Figure 8:
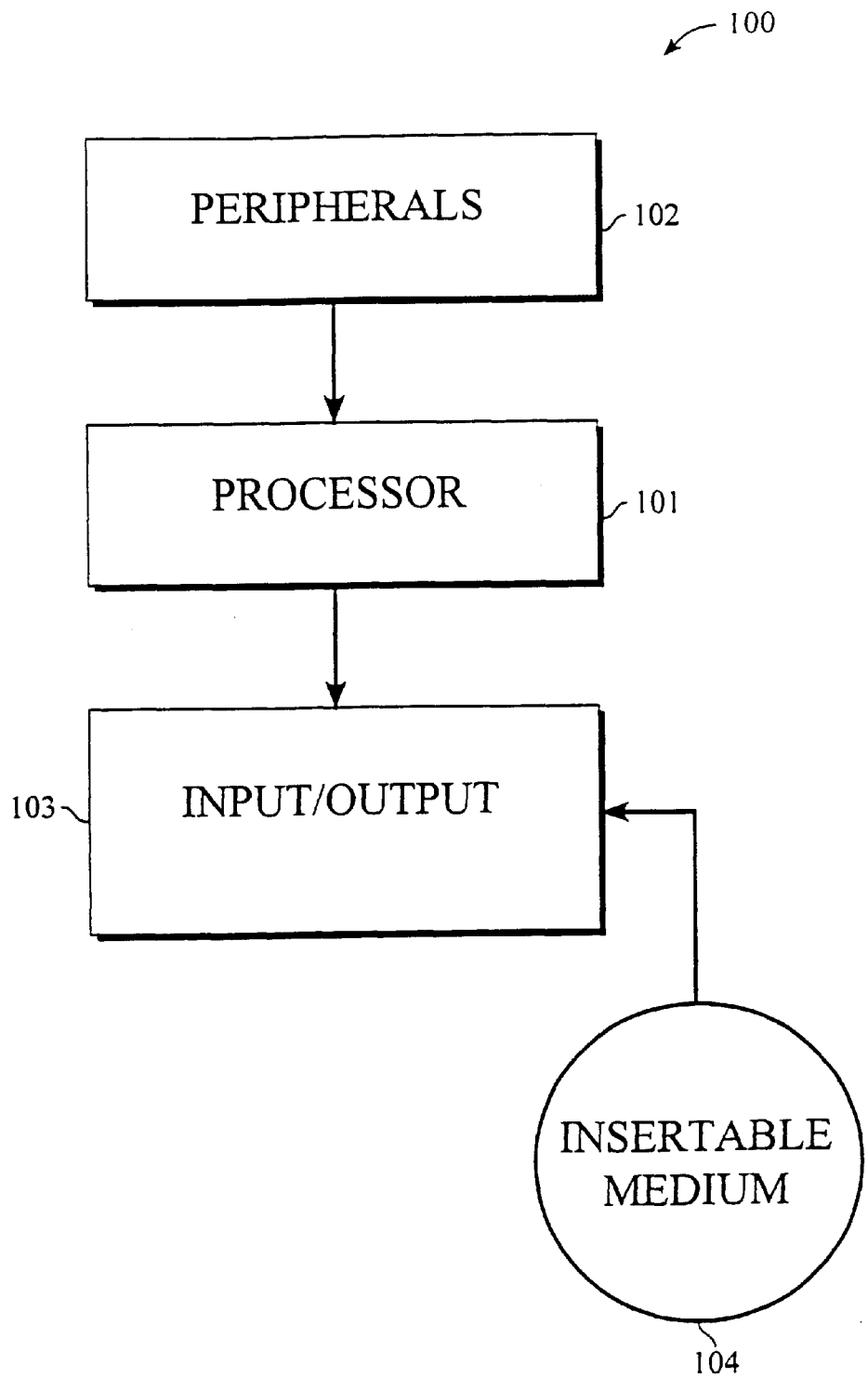
FIG. 8 is a block diagram of a computer system for implementing the design tool for automatic hold time determination in accordance with the present invention.

FIG. 8 is a block diagram illustrating a computer system 100 for implementing the design tool for automatic hold time determination in accordance with the present invention. The computer system 100 includes a processor 101 and peripherals 102 connected to the processor. Further, the processor 101 is connected to an input/output device 103. The input/output device 103 enables insertion and reading of a medium 104 containing software or other medium containing information that provides circuit layout parameters that describe the circuit and its storage elements. When the information medium is inserted and the information thereon is read, the processor 101 is provided with the information needed to perform a hold time analysis on the circuit.

Although preferred embodiments of this invention have been shown and described herein, changes and modifications may be made therein without departing from the invention. The disclosure is intended to cover all such changes and modifications coming within the spirit and scope of the invention.

What is claimed is:

1. A method for enhancing performance of an electrical circuit, the method comprising:

providing a layout for an electrical circuit having at least one storage element hold time deficiency and having a selected circuit path P that passes through the hold-time-deficient storage element;

simulating, on a computer, insertion of a selected time delay element, having a time delay value that is at least equal to the hold time deficiency, at a selected location on the circuit path P immediately preceding the hold-time-deficient storage element;

determining cycle time, as a result of insertion of the time delay element into the path P, for at least one circuit path P' that does not coincide with the circuit path P;

when the cycle time of the at least one circuit path P' does not exceed a selected threshold time value, permitting insertion of the time delay element at the selected location; and when the cycle time of the at least one path P' exceeds the threshold time value:
  withholding insertion of the time delay element at the selected location;
  simulating insertion of the selected time delay at a second selected location, preceding at least one logic element that immediately precedes the hold-time-deficient storage element, on a path that passes through the hold-time-deficient storage element;
  determining a second cycle time, as a result of insertion of the selected time delay element, for at least one circuit path that does not include the hold-timedeficient storage element and the time delay element, at the second selected location; and when the second cycle time does not exceed the threshold value, permitting insertion of the time delay element at the second selected location.

2. The method of claim 1, further comprising withholding insertion of said time delay element at said second selected location when said second cycle time exceeds said threshold time value.

3. A method of analyzing signal timing in an electrical circuit, the method comprising:

providing a layout for an electrical circuit having at least first and second storage elements and having a circuit path P from the first storage element to the second storage element;

determining if the second storage element has a hold time deficiency;

when the second storage element has a hold time deficiency, simulating, on a computer, insertion of a signal time delay element, having a selected time delay value, into the path P at a selected location;

determining if at least one additional circuit path P' which does not coincide with the path P, has a cycle time, as a result of insertion of the time delay element into the path P, that is greater than a selected threshold time value; and when the cycle time of the path P' is greater than the threshold time value, withholding insertion of the time delay element into the path P at the selected location.

4. The method of claim 3, further comprising:

choosing a second selected location for said selected time delay element, upstream from said second storage element and upstream from at least one logic element that immediately precedes said second storage element on a path that passes through said second storage element;

simulating insertion of said time delay element at the second selected location;

determining a second cycle time, as a result of insertion of said time delay element at the second selected location, for at least one circuit path that includes said second storage element and that does not coincide with said path P; and when the second cycle time does not exceed said selected threshold value, permitting insertion of said time delay element at the second selected location.

5. The method of claim 3, further comprising providing at least one logic element on said path P between said first and second storage elements.

6. The method of claim 5, further comprising choosing said location for said time delay element between said at least one logic element and one of said first storage element and said second storage element.

7. A system for enhancing performance of an electrical circuit, the system comprising:

a source that provides a layout of an electrical circuit having at least one storage element with a hold time deficiency and having a selected circuit path P that passes through the hold-time-deficient storage element; and a computer that is programmed:

to simulate insertion of a selected time delay element, having a time delay value that is at least equal to the hold time deficiency, at a selected location on the selected circuit path immediately preceding the hold-time-deficient storage element;

to determine cycle time, as a result of insertion of the time delay element into the path P, for at least one circuit path P' that does not coincide with the circuit path P;

when the cycle time of the at least one circuit path P' does not exceed a selected threshold time value, to permit insertion of the time delay element at the selected location; and when the cycle time of the at least one path P' exceeds the threshold time value:

to withhold insertion of said time delay element at said selected location;

to simulate insertion of the selected time delay at a second selected location, preceding at least one logic element that immediately precedes the hold-time-deficient storage element, on a path that passes through the hold-time-deficient storage element;

to determine a second cycle time, as a result of insertion of the time delay element, for at least one circuit path that does not include the hold-time-deficient storage element and the time delay element, at the second selected location; and when the second cycle time does not exceed the threshold value, to permit insertion of the time delay element at the second selected location.

8. The system of claim 7, wherein said computer is further programmed to withhold insertion of said time delay element at said second selected location when said second cycle time exceeds said threshold time value.

9. A system for analyzing signal timing in an electrical circuit, the system comprising:

a source for an electrical circuit layout having at least first and second storage elements, having a circuit path P from the first storage element to the second storage element; and a computer that is programmed:

to determine if the second storage element has a hold time deficiency;

when the second storage element has a hold time deficiency, to simulate insertion of a signal time delay element, having a selected time delay value, into the path P at a selected location;

to determine if at least one additional circuit path P' that does not coincide with the path P has a cycle time, as a result of insertion of the time delay element into the path P, that is greater than a selected threshold time value; and when the cycle time of said path P' is greater than the threshold time value, to withhold insertion of the time delay element into the path P at the selected location.

10. The system of claim 9, wherein said computer is further programmed:

to choose a second selected location for said selected time delay element, upstream from said second storage element and upstream from at least one logic element that immediately precedes said second storage element on a path that passes through said second storage element;

to simulate insertion of said time delay element at the second selected location;

to determine a second cycle time, as a result of insertion of said time delay element at the second selected location, for at least one circuit path that includes said second storage element and is distinct from said path P; and when the second cycle time does not exceed said selected threshold value, to permit insertion of said time delay element at the second selected location.

11. The system of claim 9, wherein at least one logic element is provided on said path P, between said first and second storage elements.

12. The system of claim 11, wherein said computer is further programmed to choose said location for said time delay element between said at least one logic element and one of said first storage element and said second storage element.

13. A method for enhancing performance of an electrical circuit, the method comprising:

providing a layout for an electrical circuit having at least one storage element hold time deficiency and having a selected circuit path P that passes through the hold-time-deficient storage element;

simulating, on a computer, insertion of a selected time delay element, having a time delay value that is at least equal to the hold time deficiency, at a selected location on the circuit path P immediately preceding the hold-time-deficient storage element;

determining cycle time, as a result of insertion of the time delay element into the path P, for at least one circuit path P' that does not coincide with the selected circuit path;

when the cycle time of the at least one circuit path P' does not exceed a selected threshold time value, permitting insertion of the time delay element at the selected location;

when the cycle time of the at least one path P' exceeds the threshold time value:
  withholding insertion of the time delay element at the selected location;
  simulating variation of a time delay associated with signal receipt and processing at the hold-time-deficient storage element;
  determining a time delay value for signal receipt and processing at the hold-time-deficient storage element that is sufficient so that the cycle time, for the at least one circuit path P', does not exceed the selected threshold time value; and
  when the determined time delay value is within a range of permitted time delay for the hold-time-deficient storage element, permitting use of the hold-time-deficient storage element with the determined time delay.

14. A method of analyzing signal timing in an electrical circuit, the method comprising:

providing a layout for an electrical circuit having at least first and second storage elements, having a circuit path P from the first storage element to the second storage element;

determining if the second storage element has a hold time deficiency;

when the second storage element has a hold time deficiency, simulating, on a computer, insertion of a signal time delay element, having a selected time delay value, into the path P at a selected location;

determining if at least one additional circuit path P', which does not coincide with the path P, has a cycle time, as a result of insertion of the time delay element into the path P, that is greater than a selected threshold time value; and when the cycle time of the path P' is not greater than the selected threshold time value, permitting insertion of the time delay element into the path P at the selected location.

15. A system for enhancing performance of an electrical circuit, the system comprising:

a source that provides a layout of an electrical circuit having at least one storage element with a hold time deficiency and having a selected circuit path P that passes through the hold-time-deficient storage element; and a computer that is programmed:
  to simulate insertion of a selected time delay element, having a time delay value that is at least equal to the hold time deficiency, at a selected location on the circuit path P immediately preceding the hold-time-deficient storage element;
  to determine cycle time, as a result of insertion of the time delay element into the path P, for at least one circuit path P' that does not coincide with the circuit path P;
  when the cycle time of the at least one circuit path P' does not exceed a selected threshold time value, to permit insertion of the time delay element at the selected location; and
  when the cycle time of the at least one circuit path P' exceeds the threshold time value:
    to withhold insertion of the time delay element at the selected location;
    to simulate variation of a time delay associated with signal receipt and processing at the hold-time-deficient storage element;
    to determine a time delay value for signal receipt and processing at the hold-time-deficient storage element that is sufficient so that the cycle time, for the at least one circuit path P', does not exceed the threshold time value; and
    when the determined time delay value is within a range of permitted time delay for the hold-time-deficient storage element, to permit use of the hold-time-deficient storage element with the determined time delay.

16. A system for analyzing signal timing in an electrical circuit, the system comprising:

a source for an electrical circuit layout having at least first and second storage elements, having a circuit path P from the first storage element to the second storage element; and a computer that is programmed:
  to determine if the second storage element has a hold time deficiency;
  when the second storage element has a hold time deficiency, to simulate insertion of a signal time delay element, having a selected time delay value, into the path P at a selected location;
  to determine if at least one additional circuit path P' that does not coincide with the path P has a cycle time, as a result of insertion of the time delay element into the path P, that is greater than a selected threshold time value; and
  when the cycle time of the path P' is not greater than the threshold time value, to permit insertion of the time delay element into the path P at the selected location.

* * * * *